(12) United States Patent
Bulsara et al.

(10) Patent No.: US 8,253,181 B2
(45) Date of Patent: Aug. 28, 2012

(54) STRAINED CHANNEL DYNAMIC RANDOM ACCESS MEMORY DEVICES

(75) Inventors: Mayank Bulsara, Cambridge, MA (US); Matthew T. Currie, Windham, NH (US); Anthony J. Lochtefeld, Somerville, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 423 days.

(21) Appl. No.: 12/167,828

(22) Filed: Jul. 3, 2008

(65) Prior Publication Data

US 2008/0265299 A1    Oct. 30, 2008

Related U.S. Application Data

(63) Continuation of application No. 10/966,959, filed on Oct. 15, 2004, now Pat. No. 7,410,861, which is a continuation of application No. 10/218,007, filed on Aug. 13, 2002, now Pat. No. 6,891,209.

(60) Provisional application No. 60/311,801, filed on Aug. 13, 2001.

(51) Int. Cl.
*H01L 29/94* (2006.01)

(52) U.S. Cl. ............................ 257/301; 257/E29.193

(58) Field of Classification Search .............. 257/301, 257/E29.193
See application file for complete search history.

(56) References Cited

U.S. PATENT DOCUMENTS

| | | |
|---|---|---|
| 4,104,086 A | 8/1978 | Bondur et al. |
| 4,353,086 A | 10/1982 | Jaccodine et al. |
| 4,569,701 A | 2/1986 | Oh |
| 4,604,150 A | 8/1986 | Lin |
| 4,649,625 A | 3/1987 | Lu |
| 5,089,872 A | 2/1992 | Ozturk et al. |
| 5,155,657 A * | 10/1992 | Oehrlein et al. ............ 361/313 |
| 5,242,847 A | 9/1993 | Ozturk et al. |
| 5,444,302 A | 8/1995 | Nakajima et al. |
| 5,662,768 A | 9/1997 | Rostoker |
| 5,898,189 A | 4/1999 | Gardner et al. |
| 5,913,125 A | 6/1999 | Brouillette et al. |
| 5,982,005 A | 11/1999 | Hidaka et al. |
| 6,069,049 A | 5/2000 | Geiss et al. |
| 6,180,480 B1 | 1/2001 | Economikos et al. |
| 6,191,432 B1 | 2/2001 | Sugiyama et al. |
| 6,204,524 B1 | 3/2001 | Rhodes |
| 6,228,694 B1 | 5/2001 | Doyle et al. |
| 6,232,138 B1 | 5/2001 | Fitzgerald et al. |

(Continued)

FOREIGN PATENT DOCUMENTS

EP    0 862 207 A1    9/1998

(Continued)

OTHER PUBLICATIONS

Gannavaram, et al., "Low Temperature (<800° C.) Recessed Junction Selective Silicon-Germanium Source/Drain Technology for sub-70 nm CMOS," *IEEE International Electron Device Meeting Technical Digest*, (2000), pp. 137-440.

(Continued)

*Primary Examiner* — Julio J Maldonado
*Assistant Examiner* — Hajar Kolahdouzan
(74) *Attorney, Agent, or Firm* — Slater & Matsil, L.L.P.

(57) ABSTRACT

DRAM trench capacitors formed by, inter alia, deposition of conductive material into a trench or doping the semiconductor region in which the trench is defined.

30 Claims, 6 Drawing Sheets

U.S. PATENT DOCUMENTS

| | | | |
|---|---|---|---|
| 6,235,568 B1 | 5/2001 | Murthy et al. | |
| 6,258,689 B1 | 7/2001 | Bronner et al. | |
| 6,281,532 B1 | 8/2001 | Doyle et al. | |
| 6,294,424 B1 | 9/2001 | Kang et al. | |
| 6,326,664 B1 | 12/2001 | Chau et al. | |
| 6,395,597 B2 | 5/2002 | Noble | |
| 6,399,976 B1 | 6/2002 | Geiss et al. | |
| 6,404,003 B1 | 6/2002 | McMillan et al. | |
| 6,429,470 B1 | 8/2002 | Rhodes | |
| 6,441,423 B1 | 8/2002 | Mandelman et al. | |
| 6,495,868 B2 | 12/2002 | Fitzgerald et al. | |
| 6,563,152 B2 | 5/2003 | Roberds et al. | |
| 6,583,000 B1 | 6/2003 | Hsu et al. | |
| 6,589,335 B2 | 7/2003 | Bulsara et al. | |
| 6,594,293 B1 | 7/2003 | Bulsara et al. | |
| 6,605,498 B1 | 8/2003 | Murthy et al. | |
| 6,621,131 B2 | 9/2003 | Murthy et al. | |
| 6,657,223 B1 | 12/2003 | Wang et al. | |
| 6,690,043 B1* | 2/2004 | Usuda et al. | 257/194 |
| 6,703,648 B1 | 3/2004 | Xiang et al. | |
| 6,743,684 B2 | 6/2004 | Liu | |
| 6,800,892 B2 | 10/2004 | Bhattacharyya | |
| 6,828,211 B2 | 12/2004 | Chi et al. | |
| 6,849,508 B2 | 2/2005 | Lochtefeld et al. | |
| 6,891,209 B2 | 5/2005 | Bulsara et al. | |
| 6,902,965 B2 | 6/2005 | Ge et al. | |
| 6,927,444 B2 | 8/2005 | Park et al. | |
| 6,936,881 B2 | 8/2005 | Yeo et al. | |
| 6,940,705 B2 | 9/2005 | Yeo et al. | |
| 6,982,472 B2 | 1/2006 | Kiyotoshi et al. | |
| 7,015,530 B2 | 3/2006 | Bhattacharyya | |
| 7,018,886 B2 | 3/2006 | Chi et al. | |
| 7,037,772 B2 | 5/2006 | Yeo et al. | |
| 7,042,052 B2 | 5/2006 | Bhattacharyya | |
| 2001/0025998 A1* | 10/2001 | Tsuchiaki | 257/402 |
| 2001/0039087 A1* | 11/2001 | Jammy et al. | 438/243 |
| 2001/0040244 A1 | 11/2001 | Fitzgerald et al. | |
| 2002/0030227 A1 | 3/2002 | Bulsara et al. | |
| 2002/0063292 A1 | 5/2002 | Armstrong et al. | |
| 2002/0129762 A1 | 9/2002 | Bulsara et al. | |
| 2002/0190284 A1 | 12/2002 | Murthy et al. | |
| 2003/0013287 A1 | 1/2003 | Lochtefeld et al. | |
| 2003/0017667 A1 | 1/2003 | Park et al. | |
| 2003/0030091 A1 | 2/2003 | Bulsara et al. | |
| 2004/0007724 A1 | 1/2004 | Murthy et al. | |
| 2004/0014276 A1 | 1/2004 | Murthy et al. | |
| 2004/0040493 A1 | 3/2004 | Vineis et al. | |
| 2004/0063300 A1 | 4/2004 | Chi | |
| 2004/0070035 A1 | 4/2004 | Murthy et al. | |
| 2004/0084735 A1 | 5/2004 | Murthy et al. | |
| 2004/0115916 A1 | 6/2004 | Lochtefeld et al. | |
| 2004/0119101 A1 | 6/2004 | Schrom et al. | |
| 2004/0142545 A1 | 7/2004 | Ngo et al. | |
| 2004/0155317 A1 | 8/2004 | Bhattacharyya | |
| 2004/0156225 A1 | 8/2004 | Bhattacharyya | |
| 2004/0173815 A1 | 9/2004 | Yeo et al. | |
| 2005/0018380 A1 | 1/2005 | Yeo et al. | |
| 2005/0023586 A1 | 2/2005 | Bhattacharyya | |
| 2005/0026390 A1 | 2/2005 | Chi | |
| 2005/0035389 A1 | 2/2005 | Bulsara et al. | |
| 2005/0059214 A1 | 3/2005 | Cheng et al. | |
| 2005/0067647 A1 | 3/2005 | Bulsara et al. | |
| 2005/0098774 A1 | 5/2005 | Lochtefeld et al. | |
| 2005/0205929 A1 | 9/2005 | Nagano et al. | |
| 2005/0208717 A1 | 9/2005 | Yeo et al. | |
| 2005/0230732 A1 | 10/2005 | Park et al. | |
| 2005/0247982 A1 | 11/2005 | Bhattacharyya | |
| 2006/0024877 A1 | 2/2006 | Mandelman et al. | |
| 2006/0121394 A1 | 6/2006 | Chi | |
| 2006/0125010 A1 | 6/2006 | Bhattacharyya | |
| 2006/0128107 A1 | 6/2006 | Bhattacharyya | |

FOREIGN PATENT DOCUMENTS

| | | |
|---|---|---|
| EP | 0 987 765 A2 | 3/2000 |
| WO | WO-01/17014 A1 | 3/2001 |
| WO | WO-01/54202 A1 | 7/2001 |

OTHER PUBLICATIONS

Ge et al., "Process-Strained Si (PSS) CMOS Technology Featuring 3D Strain Engineering," *IEEE International Electron Devices Meeting Technical Digest*, (2003) pp. 73-76.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 11.6.1-11.6.3.

Hamada et al., "A New Aspect of Mechanical Stress Effects in Scaled MOS Devices," *IEEE Transactions on Electron Devices*, vol. 38, No. 4 (Apr. 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised Si1-xGex Source/Drain", *IEEE Electron Device Letters*, vol. 21, No. 9, (Sep. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest*, (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Shimizu et al., "Local Mechanical-Stress Control (LMC): A New Technique for CMOS-Performance Enhancement," *IEEE International Electron Devices Meeting Technical Digest*, (2001), pp. 433-436.

Thompson et al., "A 90 nm Logic Technology Featuring 50nm Strained-Silicon Channel Transistors, 7 layers of Cu Interconnects, Low k ILD, and $1_{um}^2$ SRAM Cell," *IEEE International Electron Devices Meeting Technical Digest*, (2002), pp. 61-64.

Thompson et al., "A Logic Nanotechnology Featuring Strained-Silicon," *IEEE Electron Device Letters*, vol. 25, No. 4 (Apr. 2004), pp. 191-193.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

* cited by examiner

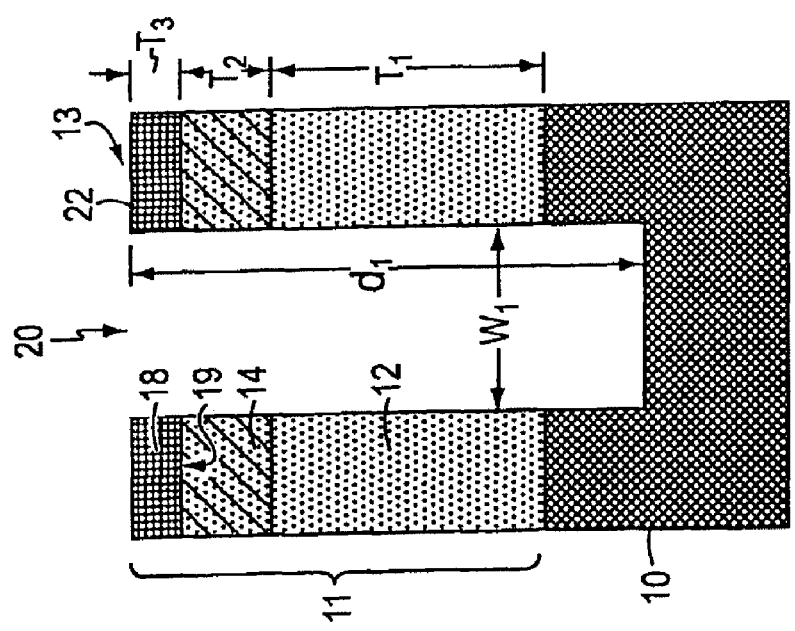
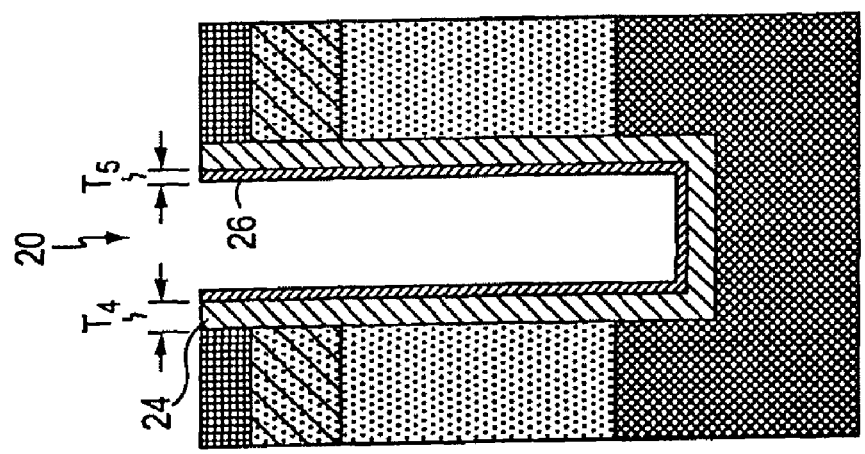
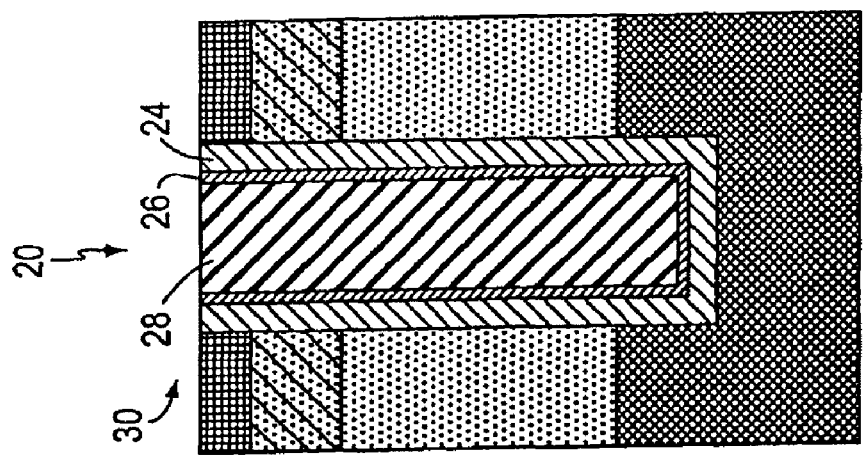
FIG. 1A
FIG. 1B
FIG. 1C

STRAINED CHANNEL DYNAMIC RANDOM ACCESS MEMORY DEVICES

RELATED APPLICATIONS

This application is a continuation of U.S. patent application Ser. No. 10/966,959, filed Oct. 15, 2004, which is a continuation of U.S. patent application Ser. No. 10/218,007, filed Aug. 13, 2002, which claims the benefit of U.S. Provisional Application Ser. No. 60/311,801 filed Aug. 13, 2001; the entire disclosures of these three applications are hereby incorporated by reference.

FIELD OF THE INVENTION

This invention relates generally to semiconductor structures and particularly to semiconductor structures formed on strained semiconductor layers.

BACKGROUND

Relaxed silicon-germanium (SiGe) virtual substrates, including a tensilely strained layer and a relaxed underlying layer, enable the production of novel silicon (Si)-, germanium (Ge)-, and SiGe-based devices such as field-effect transistors (FETs). A "virtual substrate" includes a layer of SiGe that has been relaxed to its equilibrium lattice constant (i.e., one that is larger than that of Si). This relaxed SiGe layer can be directly applied to a Si substrate (e.g., by wafer bonding or direct epitaxy) or atop a graded SiGe layer, in which the lattice constant of the SiGe material has been increased gradually over the thickness of the layer. The SiGe virtual substrate can also incorporate buried insulating layers, in the manner of a silicon-on-insulator (SOI) wafer. In order to fabricate high-performance devices on these platforms, thin strained layers of Si, Ge, or SiGe are grown on the relaxed SiGe virtual substrates. The resulting biaxial tensile or compressive strain alters the carrier mobilities in the layers, enabling the fabrication of high-speed and/or low-power devices. Utilizing both strain and bandgap engineering, modulation-doped FETs (MODFETs) and metal-oxide-semiconductor FETs (MOSFETs) may be tailored for enhanced performance analog or digital applications. However, because these devices are fabricated on Si/SiGe virtual substrates rather than the Si substrates commonly utilized for complementary MOS (CMOS) technologies, they present new processing challenges.

One processing challenge to device fabrication on Si/SiGe virtual substrates is the definition of dynamic random access memory (DRAM) trench storage capacitors. DRAM storage capacitors require high quality insulating layers for storing charge. A conventional DRAM trench storage capacitor formed on, for example, a p-type Si substrate may include an outer plate of, e.g., n-type doped Si substrate material (also referred to as the buried plate), a high-quality insulator grown on the outer plate, and an inner plate of, e.g., n-type doped polysilicon. Thus, two conducting plates are separated by an insulating plate. Traditionally, in DRAM trench capacitors fabricated in bulk Si substrates, the insulator is a thermally-grown silicon dioxide layer or nitrided silicon dioxide.

A conventional DRAM trench storage capacitor structure ordinarily is not suitable for fabrication on SiGe virtual substrates. The trench for this structure may be 5-10 micrometers (μm) deep, and would, therefore, extend into the relaxed SiGe layer. This layer may have many defects due to a high density of dislocations necessary to relax the strain in this layer. This high defect density, in turn, may interfere with subsequent efforts to create an insulator. In particular, thermal growth may be hampered by the defects and may result in a leaky insulator with many imperfections. Thus, the high defect density of the relaxed SiGe prevents the formation of the good-quality thermal dielectric incorporated in conventional DRAM trench capacitors. Furthermore, the nature of the insulator produced by thermal oxidation of SiGe is not well understood, so that even if the trench is etched in a defect-free SiGe region, in some applications, the thermal oxide may not be of sufficiently good quality for DRAM charge storage.

An additional challenge to the formation of DRAM trench capacitors in SiGe virtual substrates pertains to the formation of the outer plate. In conventional processes, the outer or buried plate is created for electrical isolation, either by implantation or by out-diffusion from a sacrificial dopant source deposited in the trench, prior to trench sidewall oxidation and inner-plate deposition. For either method of outer plate formation, the thermal steps used in conventional trench-capacitor processes for proper distribution of dopants may employ temperatures too high for use with Si/SiGe substrates.

Despite the inherent challenges, a DRAM trench capacitor is generally a better design choice for Si/SiGe substrates than, for example, stacked capacitor structures. First, the trench capacitor is more compatible with front-end CMOS device fabrication processes, because the alternative stacked capacitor is traditionally fabricated using chemical vapor deposition (CVD) processes at temperatures potentially high enough to degrade high-performance transistors. The trench capacitor is also more compatible with a back-end process involving many levels of metal interconnect, because it is inherently more planar than the stacked capacitor. These issues may be critical for applications which require CMOS performance on par with leading-edge microprocessors.

SUMMARY

In accordance with the present invention, DRAM trench capacitors are formed in substrates including materials other than Si, such as SiGe. These materials may be relaxed or strained, and may have dislocation defects. The challenges associated with forming a good quality thermal dielectric on trench sidewalls having many defects are addressed by forming an outer plate, an insulating layer, and an inner plate by deposition processes. In some embodiments, the quality of the deposited outer plate is sufficient for the thermal growth of the insulating layer. Alternatively, an outer plate may be formed in a trench sidewall by diffusion of dopants from a sacrificial source. Subsequently, an insulating layer may be thermally grown or deposited on the outer plate. In some other embodiments, the outer plate is formed by doping the substrate region proximate the trench, either prior to or after trench formation. This doping may be performed, for example, by an implantation process (e.g., ion implantation). Alternatively, substrate layers may be doped during epitaxial formation.

In one aspect, therefore, the invention features a method for forming a trench capacitor in a semiconductor substrate. A trench is defined extending into the semiconductor substrate from a top surface of the substrate. A first conductive material is deposited in the trench to define an outer plate, and an insulating layer is formed on the outer plate. A second conductive material is deposited in the trench to define an inner plate.

One or more of the following features may also be included. The semiconductor substrate may include a layer containing germanium, with the trench extending into the germanium-containing layer. The step of forming the insulating layer may include deposition, such as chemical vapor deposition, or the insulating layer may be grown. The semiconductor substrate may include a tensilely strained layer disposed over a relaxed layer.

In another aspect, the invention features a method for forming a trench capacitor in a semiconductor substrate, in which the semiconductor substrate includes germanium. A trench is defined extending into the semiconductor substrate from a top surface of the substrate. A material including dopants is introduced into the trench. The dopants are diffused into a sidewall of the trench to define an outer plate. The material is removed from the trench, and an insulating layer is formed on the outer plate. A conductive material is deposited on the insulating layer to define an inner plate.

One or more of the following features may also be included. The material may be introduced into the trench by deposition. The material may include polysilicon. The step of removing the material comprises may include a wet etch. The step of forming the insulating layer may include thermal growth and/or deposition.

In another aspect of the invention, a method for forming a trench capacitor in a semiconductor substrate includes providing the semiconductor substrate, with the substrate having a layer containing germanium. Dopants are introduced into a region of the substrate. A trench is defined in the substrate region, with the trench extending into the germanium-containing layer and the region including the dopants defining an outer plate along a sidewall of the trench. An insulating layer is formed in the trench proximate the outer plate, and a conductive plate is deposited on the insulating layer to define an inner plate.

One or more of the following features may also be included. The step of forming the insulating layer may include deposition, or the insulating layer may be grown.

In another aspect of the invention, a semiconductor structure includes a trench capacitor, with the trench capacitor including a trench formed in a semiconductor substrate, the trench extending into a region of the substrate including germanium. A first conductive material is disposed in the trench, defining an outer plate. An insulating layer is disposed proximate the outer plate. A second conductive material is disposed in the trench proximate the insulating layer, the second conductive material defining an inner plate.

One or more of the following features may also be included. The semiconductor substrate may include a strained layer disposed over a relaxed layer. The relaxed layer may include germanium. The strained layer may include at least one of silicon, germanium, a group II element, a group III element, a group V element, and a group VI element. The strained layer may be tensilely strained and may include silicon.

The trench may be formed on a first region of the semiconductor substrate. The structure may also include a logic circuit disposed on a second region of the semiconductor substrate, the second region of the semiconductor substrate being electrically isolated from the first region, and the logic circuit including at least one transistor.

In another aspect of the invention, a semiconductor structure includes a trench capacitor, which itself includes a trench formed in a semiconductor substrate, the trench having an interior surface and extending into a region of the substrate. A first conductive material is deposited on the interior trench surface, defining an outer plate. An insulating layer is disposed proximate the outer plate, and a second conductive material may be disposed in the trench proximate the insulating layer, with the second conductive material defining an inner plate.

One or more of the following features may also be included. The trench may extend into a region of the substrate including germanium. The first conductive material may include polysilicon. The trench may be formed on a first region of the semiconductor substrate, and the structure may also include a logic circuit disposed on a second region of the semiconductor substrate, with the second region of the semiconductor substrate being electrically isolated from the first region, and the logic circuit including at least one transistor.

In another aspect, the invention features a semiconductor structure including a substrate having a first region substantially free of germanium and a second region having a layer including germanium. The structure also includes a trench capacitor disposed in the first region, the trench capacitor including an outer plate, an insulator disposed proximate the outer plate, and an inner plate disposed proximate the insulator.

One or more of the following features may be included. The second region may include a strained layer disposed over a relaxed layer. The relaxed layer may include germanium. The strained layer may include at least one of silicon, germanium, a group II element, a group III element, a group V element, and a group VI element.

In another aspect, the invention features a semiconductor structure including a trench capacitor, which itself includes a trench formed in a semiconductor substrate, the trench extending into a region of the substrate including germanium. A conductive trench sidewall has a conductivity imparted by dopants disposed therein and defining an outer plate. An insulating layer is disposed proximate the outer plate. A second conductive material is disposed in the trench proximate the insulating layer, with the second conductive material defining an inner plate.

One or more of the following features may also be included. The dopants may be diffused into the trench sidewall. The dopants may be implanted into the trench sidewall.

In another aspect, a semiconductor structure includes a trench capacitor, which itself includes a trench formed in a semiconductor substrate, with the trench extending into a region of the substrate including germanium and dopants. A conductive trench sidewall has a conductivity imparted by the dopants disposed in the region of the substrate and defining an outer plate. An insulating layer is disposed proximate the outer plate, and a second conductive material is disposed in the trench proximate the insulating layer, the second conductive material defining an inner plate.

One or more of the following features may also be included. The substrate may include a relaxed layer including germanium and dopants, and the trench may extend into the relaxed layer. The substrate may include a strained layer and the trench may extend into the strained layer.

BRIEF DESCRIPTION OF THE FIGURES

FIGS. 1(a)-1(c) are a series of schematic cross-sectional views of a semiconductor substrate illustrating a process for fabricating a semiconductor structure on the substrate;

DETAILED DESCRIPTION

Figure 2:
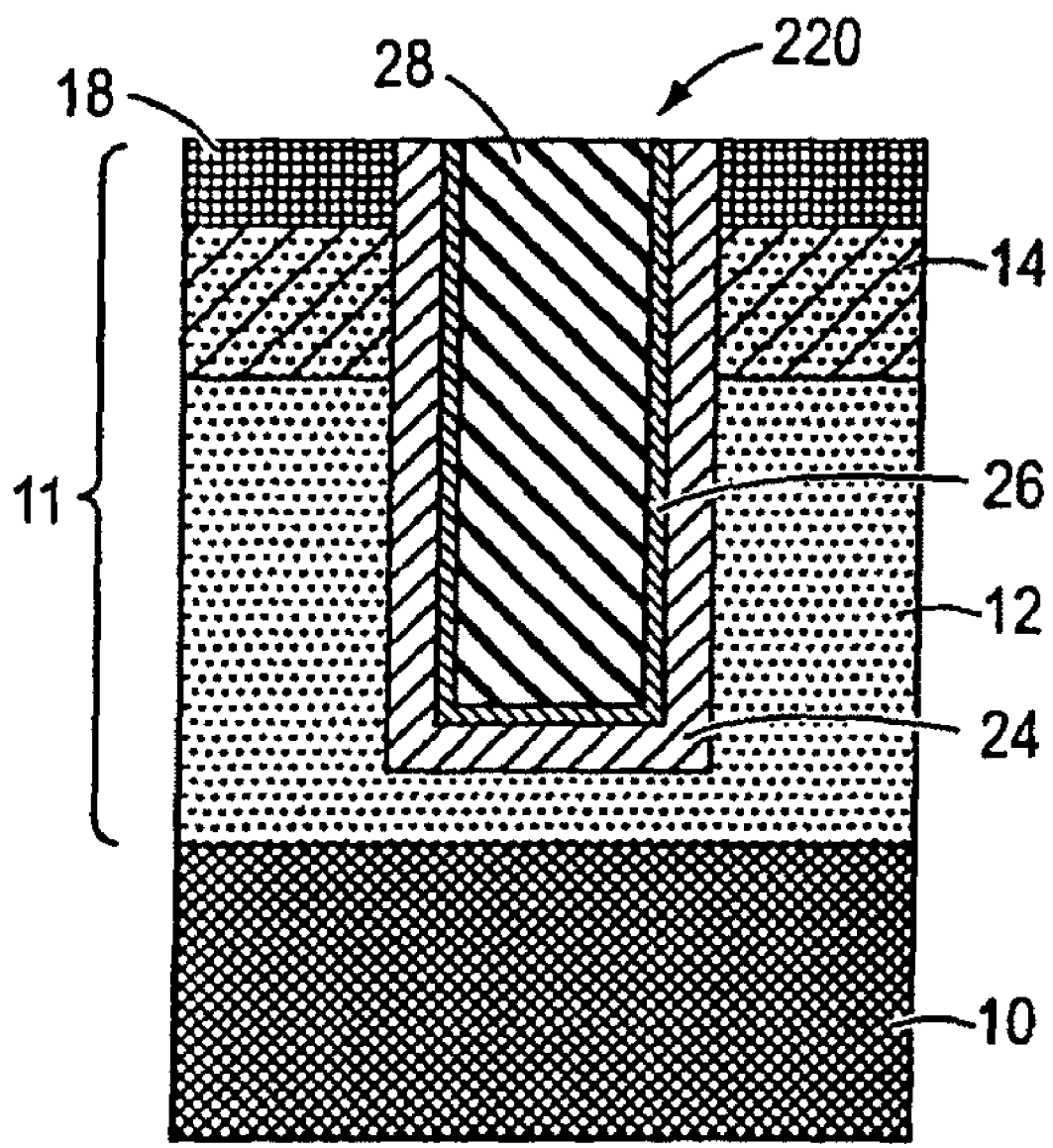
FIG. 2 is a schematic cross-sectional view of a semiconductor structure formed on an alternative substrate.

The invention provides improved semiconductor structures, including improved DRAM trench capacitors. Various features of the invention are well suited to applications utilizing MOS devices that include, for example, Si, $Si_{1-x}Ge_x$, and/or Ge layers in and or on a substrate.

The term "MOSS" is here used to refer generally to semiconductor devices that include a conductive gate spaced at least by an insulating layer from a semiconducting channel layer. The terms "SiGe" and "$Si_{1-x}Ge_x$" refer to silicon-germanium alloys.

Referring to FIGS. 1(a)-1(c), a substrate 10 comprises a semiconductor, such as silicon. Several layers collectively indicated at 11 are formed on substrate 10. Layers 11 may be grown, for example, in a CVD system, including atmospheric pressure CVD (APCVD) or low pressure CVD (LPCVD). Layers 11 and substrate 10 may be referred to together as "semiconductor substrate 13."

Layers 11 include a graded layer 12 disposed over substrate 10. Graded layer 12 may include SiGe with a grading rate of, for example, 10% Ge/μm of thickness, with a thickness $T_1$ of, for example, 2-9 μm, and grown, for example, at 600-1100° C. A relaxed layer 14 is disposed over graded layer 12. Relaxed layer 14 may include, for example, $Si_{1-x}Ge_x$ with a uniform composition containing, for example, 20-90% Ge, (i.e., $0.2 \leq x \leq 0.9$) having a thickness $T_2$ of, e.g., 0.2-2 μm. In an alternative embodiment, relaxed layer 14 may be formed directly on substrate 10, without graded layer 12.

A tensilely strained layer 18 is disposed over relaxed layer 14, sharing an interface 19 with relaxed layer 14. In an embodiment, tensilely strained layer 18 is formed of silicon. In other embodiments, tensilely strained layer 18 may be formed of SiGe, or at least one of a group II, a group III element, a group V, and a group VI element. Tensilely strained layer 18 may have a starting thickness $T_3$ of, for example, 50-300 Å.

In some embodiments, a compressively strained layer (not shown) may be disposed between relaxed layer 14 and tensilely strained layer 18. In an embodiment, the compressively strained layer includes $Si_{1-y}Ge_y$ with a Ge content (y) higher than the Ge content (x) of relaxed $Si_{1-x}Ge_x$ layer 14. The compressively strained layer may contain, for example 40-100% Ge and have a thickness of, e.g., 10-200 angstroms (Å).

A trench 20 is defined in layers 11, extending into semiconductor substrate 13 from a top surface 22 of semiconductor substrate 13. Trench 20 may be defined by, e.g., reactive ion etching (RIE). Trench 20 may have an aspect ratio of 40:1, with a width w, of, e.g., 0.3 μm and a depth $d_1$ of, e.g., 12 μm. In the illustrated embodiment, trench 20 extends through layers 11 into substrate 10.

Referring to FIG. 1(b), a first conductive material is deposited in trench 20 to define an outer plate 24. First conductive material may be, for example, n-type doped polysilicon, having a thickness $T_4$ of, e.g., 100-500 Å. Outer plate 24 may be formed by deposition, such as by CVD or physical vapor deposition (PVD). Subsequently, an insulating layer 26 is formed on outer plate 24. Insulating layer 26 may be a thermally-grown material, such as silicon dioxide or nitrided silicon dioxide. Alternatively, insulating layer 26 may be deposited by, for example, plasma enhanced CVD (PECVD), LPCVD, or APCVD. In an embodiment in which insulating layer 26 is deposited, the composition of the sidewall of trench 20, e.g., outer plate 24, may not affect the quality of insulating layer 26. The deposited insulating material may be, for example, a material with a dielectric constant higher than that of silicon dioxide, such as tantalum oxide ($Ta_2O_5$) or silicon nitride ($Si_3N_4$). Insulating layer 26 may have a thickness $T_5$ of, e.g., 15-50 Å.

Referring to FIG. 1(c), a second conductive material is deposited in trench 20 proximate insulator 26 to define an inner plate 28. Second conductive material may be, for example, n-doped polysilicon. A DRAM trench capacitor 30 includes outer plate 24, insulator 26, and inner plate 28.

Referring to FIG. 2, in an alternative embodiment, layers 11, i.e., tensilely strained layer 18, relaxed layer 14, and graded layer 12, are sufficiently thick to completely accommodate a DRAM trench capacitor 220 including outer plate 24, insulator 26, and inner plate 28. In this embodiment, insulator 26 may be thermally grown or deposited. Relaxed layer 14 has a low density of threading dislocations, but may be substantially free of misfit dislocations. Graded layer 12, on the other hand, may have a high density of misfit dislocations. Misfit dislocations hinder the growth of good quality dielectrics on trench sidewalls, but threading dislocations have a minimal affect on thermal growth on sidewalls. Thermal growth of insulator 26 may be performed with adequate results, therefore, in some embodiments in which DRAM trench capacitor 220 is disposed primarily in relaxed layer 14.

Figure 3:
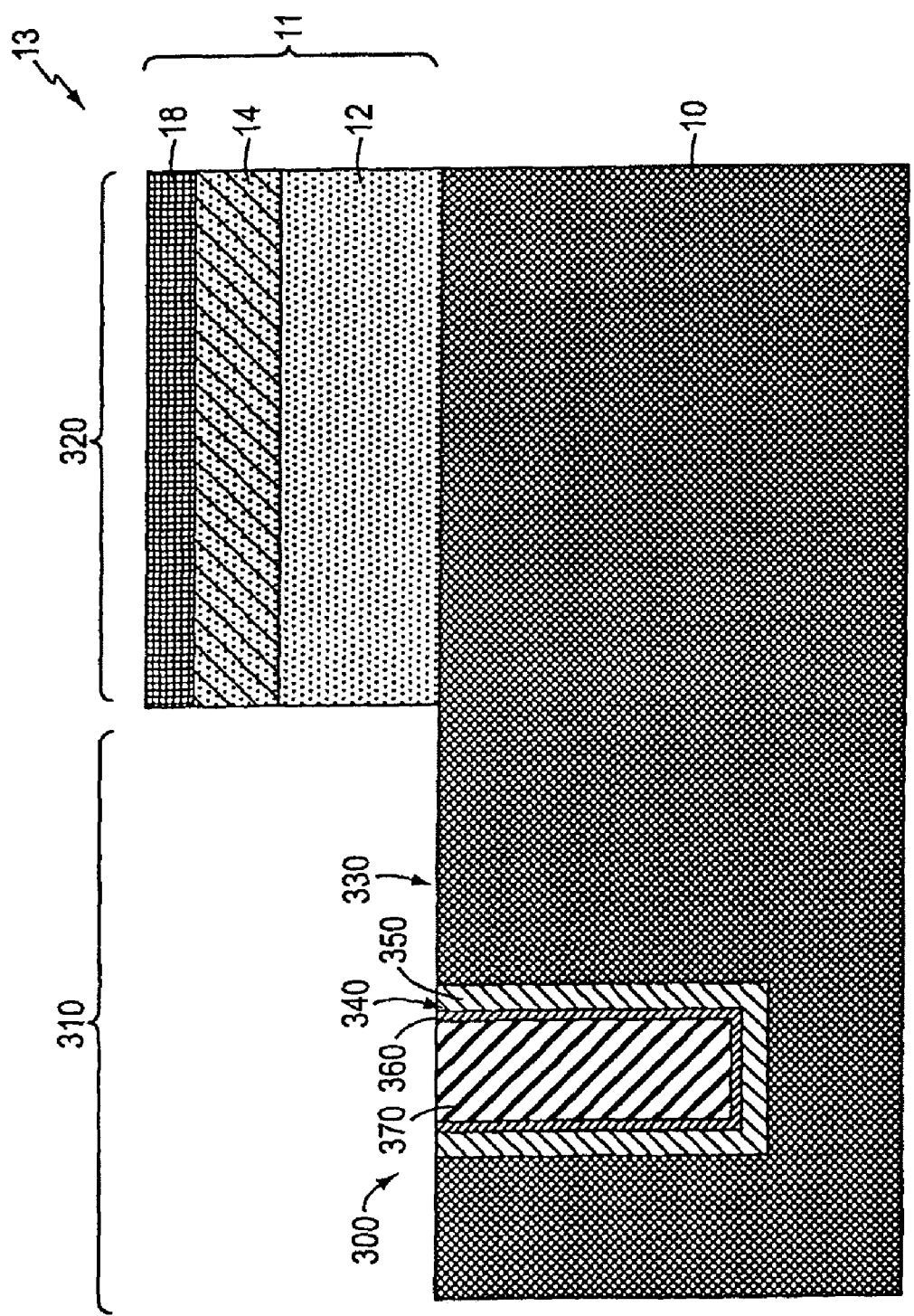
FIG. 3 is a schematic cross-sectional view of an alternative semiconductor structure.

In some embodiments, a semiconductor substrate includes a region substantially free of Ge and another region including a layer containing Ge, with a DRAM trench capacitor formed in the region substantially free of Ge. For example, referring to FIG. 3, a semiconductor substrate includes layers 11 disposed over silicon substrate 10, with layers 11 including graded layer 12, relaxed layer 14, and tensilely strained layer 18, as described with reference to FIG. 1(a). A DRAM trench capacitor 300 is formed in a first region 310 of semiconductor substrate 13. A second region 320 of semiconductor substrate 13 is allocated for the formation of other electronic or optoelectronic semiconductor devices (not shown). Portions of layers 11 disposed in first region 310 are removed by, e.g., a wet etch, a dry etch, or a thermal oxidation followed by wet or dry etch of the resulting oxide, such as silicon-germanium oxide, to expose a top surface 330 of Si substrate 10. DRAM trench capacitor 300 is formed by the etching of a trench 340 in Si substrate 10, and doping the sidewalls of trench 340 with, for example, n-type dopants to define an outer plate 350 by either ion implantation or, as described below, out-diffusion from a sacrificial dopant source deposited in trench 340. In the case of ion implantation, n-type ions, such as phosphorus or arsenic, may be implanted into trench 340. Subsequently, an insulator 360 such as silicon dioxide or nitrided silicon dioxide is thermally grown on outer plate 350, and an inner plate 370 of, e.g., n-type doped polysilicon is deposited. Semiconductor devices may be formed in region 320 prior or subsequent to DRAM trench capacitor 300 formation.

Figure 4C:
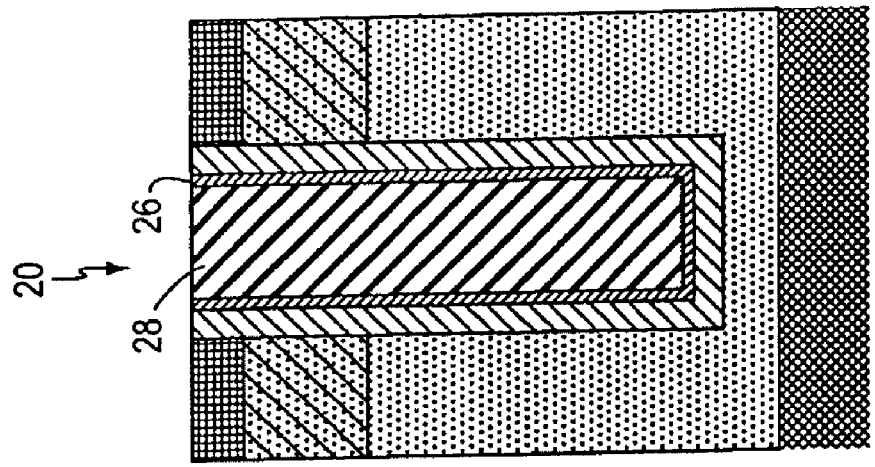
FIGS. 4(a)-4(c) are a series of schematic cross-sectional views of a semiconductor substrate illustrating an alternative process for fabricating a semiconductor structure on the substrate.
Figure 4B:
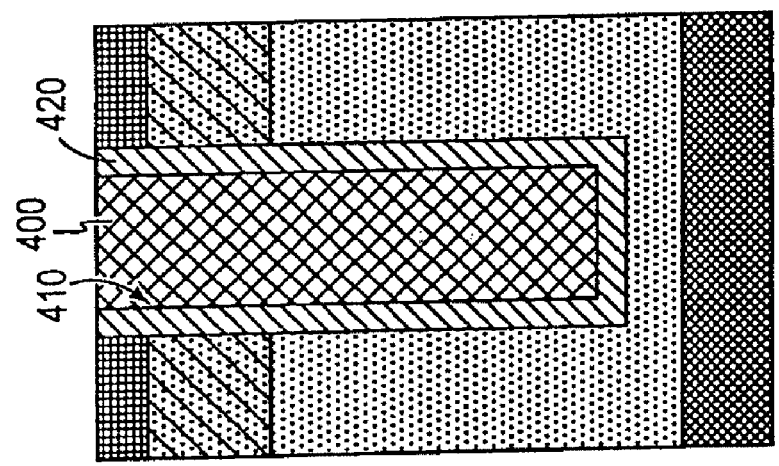
Figure 4A:
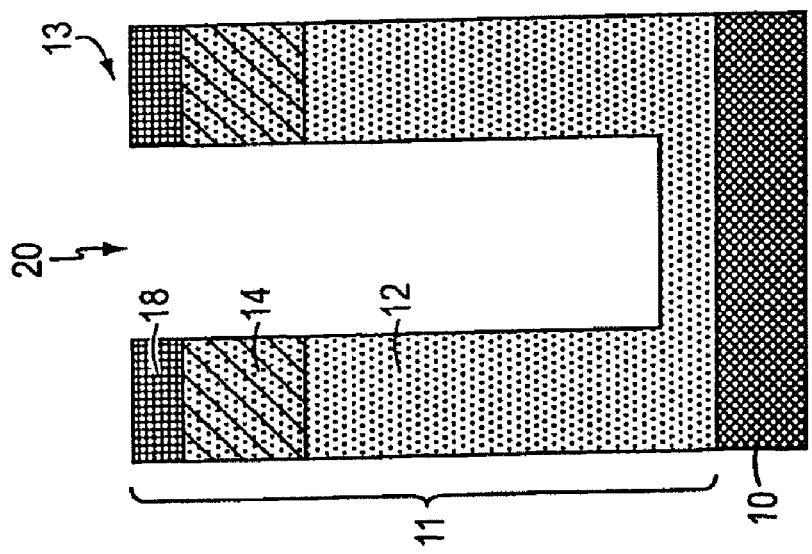

FIGS. 4(a)-4(c) illustrate fabrication of the outer plate by introduction of a sacrificial doping source and out-diffusion. Referring to FIG. 4(a) as well as to FIG. 1(a), trench 20 is etched in semiconductor substrate 13, with layers 11, including graded layer 12, relaxed layer 14, and tensilely strained layer 18, being sufficiently thick to accommodate all of trench 20.

Referring to FIG. 4(b) as well as to FIG. 4(a), trench 20 is filled with a sacrificial dopant source 400 containing dopants of the desired type. Dopant source 400 may be, for example, phosphor-silicate glass (PSG) as an n-type dopant source or boron-silicate glass (BSG) as a p-type dopant source. Dopant source 400 may be, for example, deposited by CVD. After formation of dopant source 400, a thermal anneal is performed to out-diffuse dopants from dopant source 400 into a sidewall 410 of trench 400 to define an outer plate 420. In embodiments in which layers 11 contain Ge, this thermal anneal may be performed at a temperature lower than conventionally used in silicon processing because of the greater diffusivity of n-type carriers in germanium-containing layers. The anneal may be performed, for example, at 800-900° C. for 30 minutes.

Referring to FIG. 4(c) as well as to FIG. 4(b), dopant source 400 is removed by, for example, a wet etch such as a mixture of hydrofluoric acid and water. Subsequently, insulating layer 26 is formed on outer plate 420. As discussed above with reference to FIG. 1(b), insulating layer 26 may be thermally-grown silicon dioxide or nitrided silicon dioxide. Alternatively, insulating layer 26 may be deposited by, for example, PECVD, LPCVD, or APCVD. The deposited insulating material may be, for example, a material with a dielectric constant higher than that of silicon dioxide, such as $Ta_2O_5$ or $Si_3N_4$.

A conductive material is deposited on insulating layer 26 to define inner plate 28. The conductive material may be, for example, n-type doped polysilicon.

Figure 5:
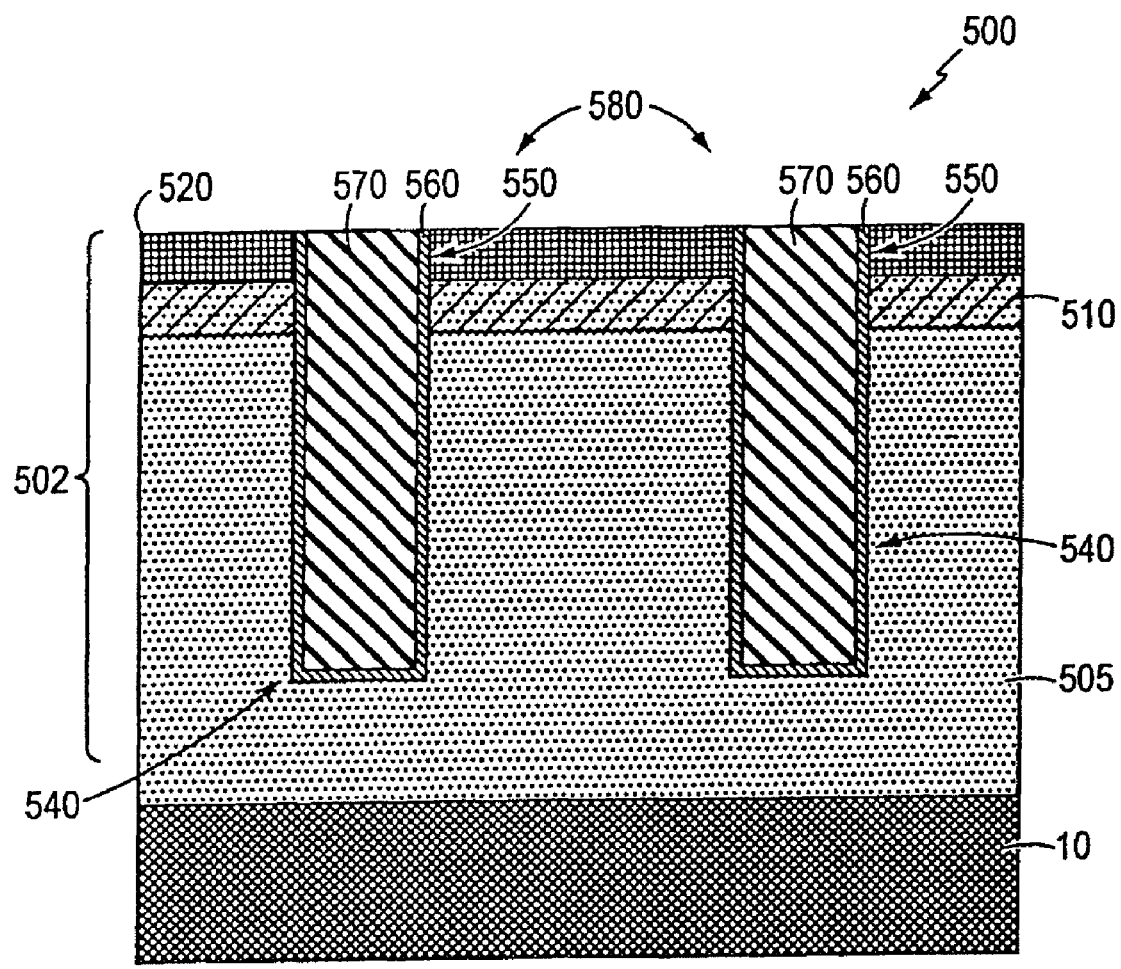
FIG. 5 is a schematic cross-sectional view of a semiconductor substrate illustrating an alternative semiconductor structure.

As shown in FIG. 5, portions of SiGe virtual substrate layers may be doped to define the outer plate of a DRAM trench capacitor. In this embodiment, a semiconductor substrate 500 includes a plurality of layers 502 disposed over substrate 10. Layers 502 include a graded layer 505 disposed over substrate 10. Graded layer 505 may be doped and may include SiGe with a grading rate of, for example, 10% Ge/μm of thickness. During epitaxial growth, graded layer 505 may be doped with n-type dopants, such as phosphorus or arsenic. In an alternative embodiment, graded layer 500 may be doped with p-type dopants such as boron or gallium. A relaxed layer 510, disposed over doped graded layer 500, may include, for example, $Si_{1-x}Ge_x$, that may be doped with the same type of dopants as are incorporated in graded layer 500, i.e., n-type or p-type dopants. A tensilely strained layer 520 is disposed over relaxed layer 510. In an embodiment, tensilely strained layer 520 is formed of silicon. In other embodiments, tensilely strained layer 520 may be formed of SiGe, or at least one of a group II, a group III, a group V, and a group VI element. The doped layer(s), e.g., at least one of tensilely strained layer 520, relaxed layer 510, and graded layer 505, form an outer plate 540 for a subsequently formed DRAM trench capacitor (as discussed below).

A trench capacitor may be formed in a doped region, so that the doped region defines the outer plate of the trench capacitor. A trench 550 is formed by, e.g., RIE in tensilely strained layer 520 relaxed layer 510, and graded layer 505. As illustrated, more than one trench 550 may be etched in semiconductor substrate 500. In these embodiments, outer plate 540 does not line individual trenches, but is a larger region of high doping into which one or more trenches 550 may be etched. An insulating layer 560 is formed in trench 550 proximate outer plate 540. Insulating layer 560 may be deposited, for example, by CVD. In some embodiments, insulating layer 560 may be grown by a thermal process. Insulating layer 560 may be formed of a dielectric like silicon dioxide or nitrided silicon dioxide. A conductive material is deposited on insulating layer 560 to define an inner plate 570. The conductive material may be, for example, doped polysilicon deposited by CVD. DRAM trench capacitor 580 includes outer plate 540, insulating layer 560, and inner plate 570.

In an alternative embodiment, dopants are introduced into layers 502 not during epitaxial growth, as described above, but by ion implantation. Here, dopants are selectively introduced into a portion of semiconductor substrate 500 in which trenches 550 are formed. The dopants may be introduced either before or after trench 550 formation. A post-implant anneal is generally performed to activate the dopants and to re-distribute the dopant concentration. In an embodiment, layers 502 contain SiGe, a material in which the diffusivity of n-type dopants is enhanced. Here, the anneal may be performed at a relatively low temperature, e.g., 800-900° C.

In an embodiment wherein it may not be practical to implant deeply enough to create a sufficiently thick outer plate 540, a two-step implant may be utilized. Here, a deep implant may be followed by epitaxial growth, and then a second implant may be performed.

Figure 6:
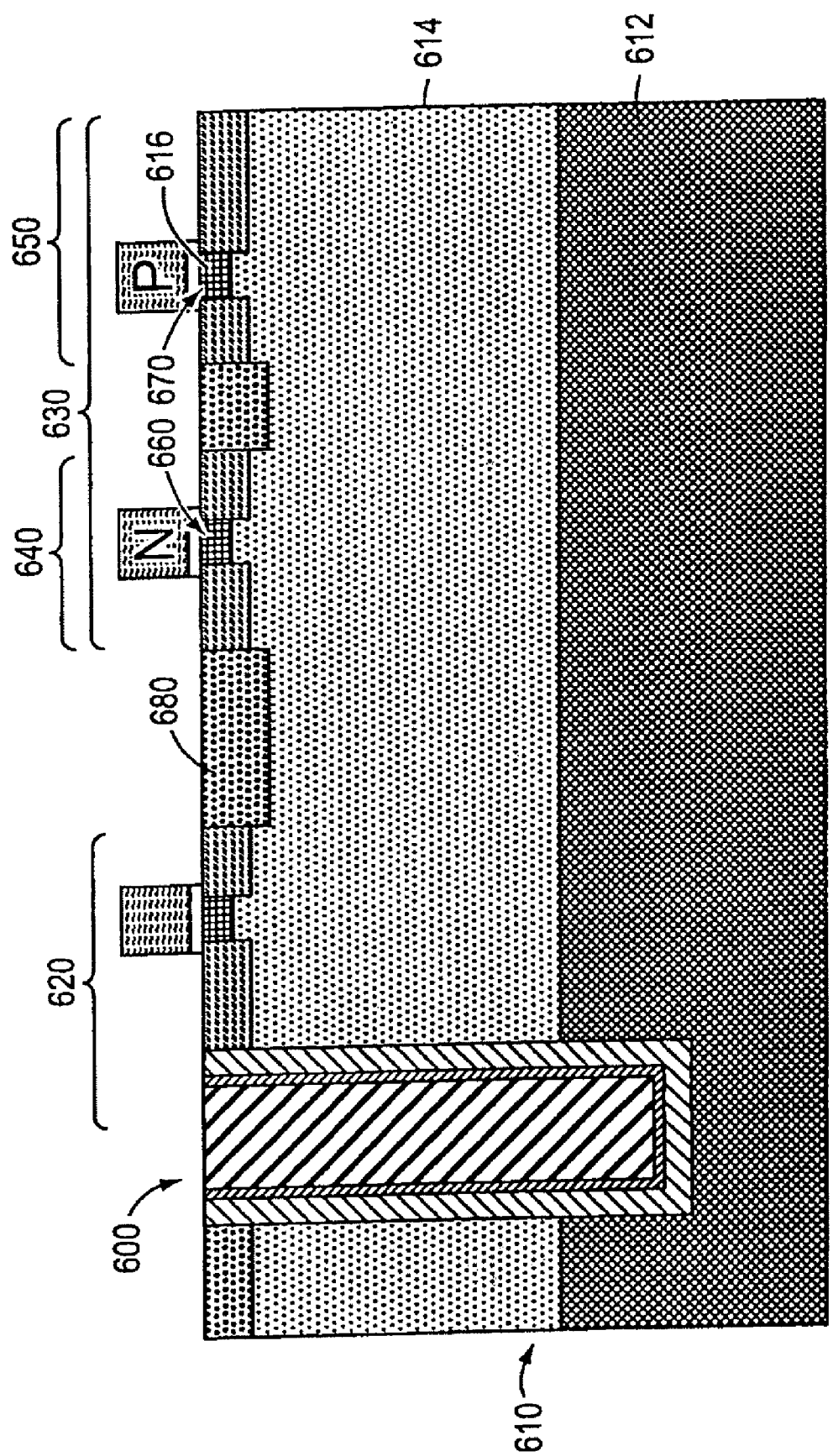
FIG. 6 is a schematic cross-sectional view of a semiconductor substrate illustrating several semiconductor structures formed on the substrate.

As shown in FIG. 6, trench capacitors formed in accordance with the present invention may be utilized in conventional CMOS logic circuits. A DRAM trench capacitor 600 is formed on a semiconductor substrate 610 in accordance with any of the methods described above. Semiconductor substrate 610 includes a substrate 612 formed of, e.g., Si, and a layer 614 including, for example, graded and relaxed SiGe layers. A tensilely strained layer 616 is disposed over layer 614. DRAM trench capacitor 600 is in electrical communication with access transistor 620. A CMOS logic circuit 630 is also formed on semiconductor substrate 610. CMOS logic circuit 630 may include an NMOS transistor 640 and a PMOS transistor 650, with each transistor having a channel 660, 670 disposed in tensilely strained layer 616. CMOS logic circuit 630 is electrically isolated from DRAM trench capacitor 600 and access transistor 620 by an isolation region 680 formed from, for example, a dielectric material such as silicon dioxide.

In alternative embodiments, the trench capacitors described above may be formed in layers which are either all SiGe, or are various combinations of SiGe and Si. The SiGe layers may include graded SiGe, relaxed SiGe, and/or compressively strained SiGe.

The invention may be embodied in other specific forms without departing from the spirit of essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A dynamic random-access memory cell comprising:
   a relaxed semiconductor layer disposed over a semiconductor substrate;
   a device disposed over the relaxed semiconductor layer and over a first region of the semiconductor substrate, the device comprising a strained channel; and
   a capacitor disposed in the relaxed semiconductor layer and in a second region of the semiconductor substrate, the capacitor being in electrical communication with the device.

2. The memory cell of claim 1, wherein the capacitor is a trench capacitor comprising an outer plate, an insulating layer, and an inner plate.

3. The memory cell of claim 1, wherein the relaxed layer comprises SiGe.

4. The memory cell of claim 1, wherein the strained channel comprises Si.

5. The memory cell of claim 1, wherein the strained channel is tensilely strained.

6. The memory cell of claim 1, further comprising a buffer layer disposed below the relaxed layer and above the semiconductor substrate.

7. The memory cell of claim 1, wherein the second region of the semiconductor substrate is substantially free of germanium.

8. The memory cell of claim 1, wherein the device is an access transistor.

9. The memory cell of claim 1, further comprising an isolation region proximate the device.

10. A semiconductor structure comprising:
   an SiGe layer disposed over a first region of a semiconductor substrate, wherein the SiGe layer directly adjoins the semiconductor substrate;
   a first semiconductor device disposed over the SiGe layer, the first semiconductor device comprising a strained layer;
   a trench capacitor disposed in a second region of the semiconductor substrate, the second region being proximate the first region; and
   a second semiconductor device disposed in the second region.

11. The structure of claim 10, further comprising an isolation region separating the first region and the second region.

12. The structure of claim 10, further comprising a plurality of transistors disposed in the first region.

13. A dynamic random-access memory module comprising a plurality of dynamic random-access memory cells, the cells comprising:
   a relaxed semiconductor layer disposed over a first region of a semiconductor substrate;
   a device disposed over the relaxed semiconductor layer, the device comprising a strained channel; and
   a capacitor disposed in an opening in a second region of the semiconductor substrate, the opening extending below and from a top surface of the second region of the semiconductor substrate, the capacitor extending to or above the top surface of the second region of the semiconductor substrate, and the capacitor being in electrical communication with the device.

14. The module of claim 13, wherein the capacitor is a trench capacitor comprising an outer plate, an insulating layer, and an inner plate.

15. The module of claim 13, wherein the relaxed layer comprises SiGe.

16. The module of claim 13, wherein the strained channel comprises Si.

17. The module of claim 13, wherein the strained channel is tensilely strained.

18. The module of claim 13, further comprising a buffer layer disposed below the relaxed layer and above the semiconductor substrate.

19. The module of claim 13, wherein the second region of the semiconductor substrate is substantially free of germanium.

20. The module of claim 13, wherein the transistor is an access transistor.

21. The module of claim 13, further comprising an isolation region proximate the transistor.

22. A method of forming a dynamic random-access memory cell, the method comprising:
   forming a relaxed semiconductor layer over a first region of a semiconductor substrate;
   forming a device over the relaxed semiconductor layer and over a first region of the semiconductor substrate, the device comprising a strained channel; and
   forming a capacitor in the relaxed semiconductor layer and in a second region of the semiconductor substrate, the capacitor being in electrical communication with the device.

23. The method of claim 22, wherein forming the capacitor comprises: forming a trench in the semiconductor substrate; forming an outer plate proximate a sidewall of the trench; forming an insulating layer proximate the outer plate; and forming an inner plate proximate the insulating layer.

24. The method of claim 22, wherein the relaxed layer comprises SiGe.

25. The method of claim 22, wherein the strained channel comprises Si.

26. The method of claim 22, wherein the strained channel is tensilely strained.

27. The method of claim 22, further comprising forming a buffer layer below the relaxed layer and above the semiconductor substrate.

28. The method of claim 22, wherein the second region of the semiconductor substrate is substantially free of germanium.

29. The method of claim 22, wherein the transistor is an access transistor.

30. The method of claim 22, further comprising forming an isolation region proximate the transistor.

* * * * *